US007667465B2

(12) United States Patent
Peluso et al.

(10) Patent No.: US 7,667,465 B2
(45) Date of Patent: Feb. 23, 2010

(54) LEAD INSERTION SYSTEM AND METHOD

(75) Inventors: Anthony G. Peluso, Girard, OH (US); Louis J. Liguore, Poland, OH (US)

(73) Assignee: Delphi Technologies, Inc., Troy, MI (US)

( * ) Notice: Subject to any disclaimer, the term of this patent is extended or adjusted under 35 U.S.C. 154(b) by 255 days.

(21) Appl. No.: 11/879,875

(22) Filed: Jul. 19, 2007

(65) Prior Publication Data

US 2009/0021265 A1 Jan. 22, 2009

(51) Int. Cl.
*G01R 31/02* (2006.01)

(52) U.S. Cl. ........................ 324/538; 439/759; 439/816

(58) Field of Classification Search .................. 324/538
See application file for complete search history.

(56) References Cited

U.S. PATENT DOCUMENTS

| | | | | |
|---|---|---|---|---|
| 4,412,715 | A | 11/1983 | Bogese, II | |
| 4,607,430 | A * | 8/1986 | Young | 29/868 |
| 4,862,927 | A | 9/1989 | Dorman et al. | |
| 5,482,092 | A | 1/1996 | Van Zeeland et al. | |
| 5,548,088 | A | 8/1996 | Gray et al. | |
| 5,765,278 | A | 6/1998 | Koike et al. | |
| 5,934,929 | A | 8/1999 | Saka et al. | |
| 6,504,378 | B1 * | 1/2003 | Renfrow | 324/538 |
| 6,916,988 | B1 | 7/2005 | Auray et al. | |
| 2007/0184686 | A1 * | 8/2007 | Hayashi et al. | 439/76.2 |

* cited by examiner

*Primary Examiner*—Vincent Q Nguyen
(74) *Attorney, Agent, or Firm*—Thomas N. Twomey

(57) ABSTRACT

A system for determining whether a lead is securely inserted into a connector includes an actuator for moving the lead to a plurality of positions, a position sensor for measuring a position of the lead relative to the connector, and a force sensor for measuring an actual force exerted on the lead at each of the plurality of positions to define an actual force signature. A processor compares the actual force signature to a predetermined force signature to determine whether the lead is disposed within the opening of the connector. The method includes the steps of moving the lead to a plurality of positions, establishing an actual force signature, and establishing a predetermined force signature. If the actual force signature is within the predetermined force signature, then the lead is securely inserted into the opening.

18 Claims, 5 Drawing Sheets

LEAD INSERTION SYSTEM AND METHOD

FIELD

The present embodiments generally relate to a system and method for determining whether a lead is securely inserted into a connector.

BACKGROUND

There are numerous methods for providing electrical connectivity to a device or between two devices. In most industrial applications, an electrical connection to a device or between two devices is accomplished using a connector wherein a terminal end of a wire or other conductor (i.e., lead) is inserted into the connector to provide electrical connectivity. To maintain conductivity, particularly in applications where the connector is subject to continuous vibration, the lead must be securely inserted into the connector.

There are a number of methods for determining whether the lead is securely inserted into the connector. One such system includes a holding device that supports the lead, an actuator coupled to the holding device for moving the lead into the connector, and a force sensor operatively connected to the actuator for measuring a peak force exerted by the actuator. The system further includes a processor that compares the peak force exerted to a predetermined peak force. If the peak force exerted exceeds the predetermined peak force, the system concludes that the lead was placed in the opening of the connector properly.

Although generally successful, known systems and methods for inserting a lead into a connector fail to account for various processing errors that can occur when inserting the lead into the opening of the connector. For instance, if the lead is in the wrong position when the actuator exerts the peak force (i.e., too far away from the connector or misaligned relative to an opening in the connector), even if the actuator exerts a peak force that exceeds the predetermined peak force, the lead will not be securely inserted into the connector. The system, however, will incorrectly conclude that lead was securely inserted. Similarly, should the actuator exert the peak force at the wrong time, the system will conclude that the lead was inserted properly simply because the peak force exerted by the actuator exceeds the predetermined peak force. Therefore, an operator must still verify that each lead was securely inserted even though the system may have concluded that the lead was properly inserted. Often times, ensuring that the lead was properly inserted is very subjective and requires the operator to pull back on the lead to determine whether the lead will easily come out of the opening in the connector. However, as technology advances, the leads and connectors are becoming smaller and smaller making this subjective determination even more difficult.

Therefore, a system and method for inserting a lead into a connector is needed that verifies that the lead was securely inserted into the connector without requiring the operator to pull back on the lead or otherwise make a subjective determination about the secure insertion of the lead into the connector.

SUMMARY

An apparatus for determining whether a lead is securely inserted into an opening defined by a connector is provided. The apparatus includes an actuator, and a position sensor operatively connected to the actuator. A force sensor is operatively connected to the actuator for measuring an actual force exerted by the actuator at each of a plurality of positions to define an actual force signature.

Furthermore, a method of determining whether a lead is securely inserted into an opening defined by a connector is provided. The method includes the step of moving the lead to a plurality of positions. The method also includes the step of establishing the actual force signature based on the movement of the lead. In addition, the method includes the step of establishing a predetermined force signature based on a predetermined range of acceptable forces at each of the plurality of positions.

BRIEF DESCRIPTION OF THE DRAWINGS

The present embodiments become better understood by reference to the following detailed description when considered in connection with the accompanying drawings, wherein.

DETAILED DESCRIPTION

A lead insertion system and method that determines whether a lead is securely inserted into an opening of a connector is provided. The lead insertion system measures an actual force at which the lead is inserted into the opening of the connector and an actual position of the lead at the time the actual force is applied. In other words, the actual force is sampled as the lead moves to various positions along an insertion route. Knowing the actual force and the position at which the force was applied, it can be determined whether the actual force applied securely inserted the lead into the opening of the connector, thus no longer requiring an operator to pull back on the lead.

Figure 1:
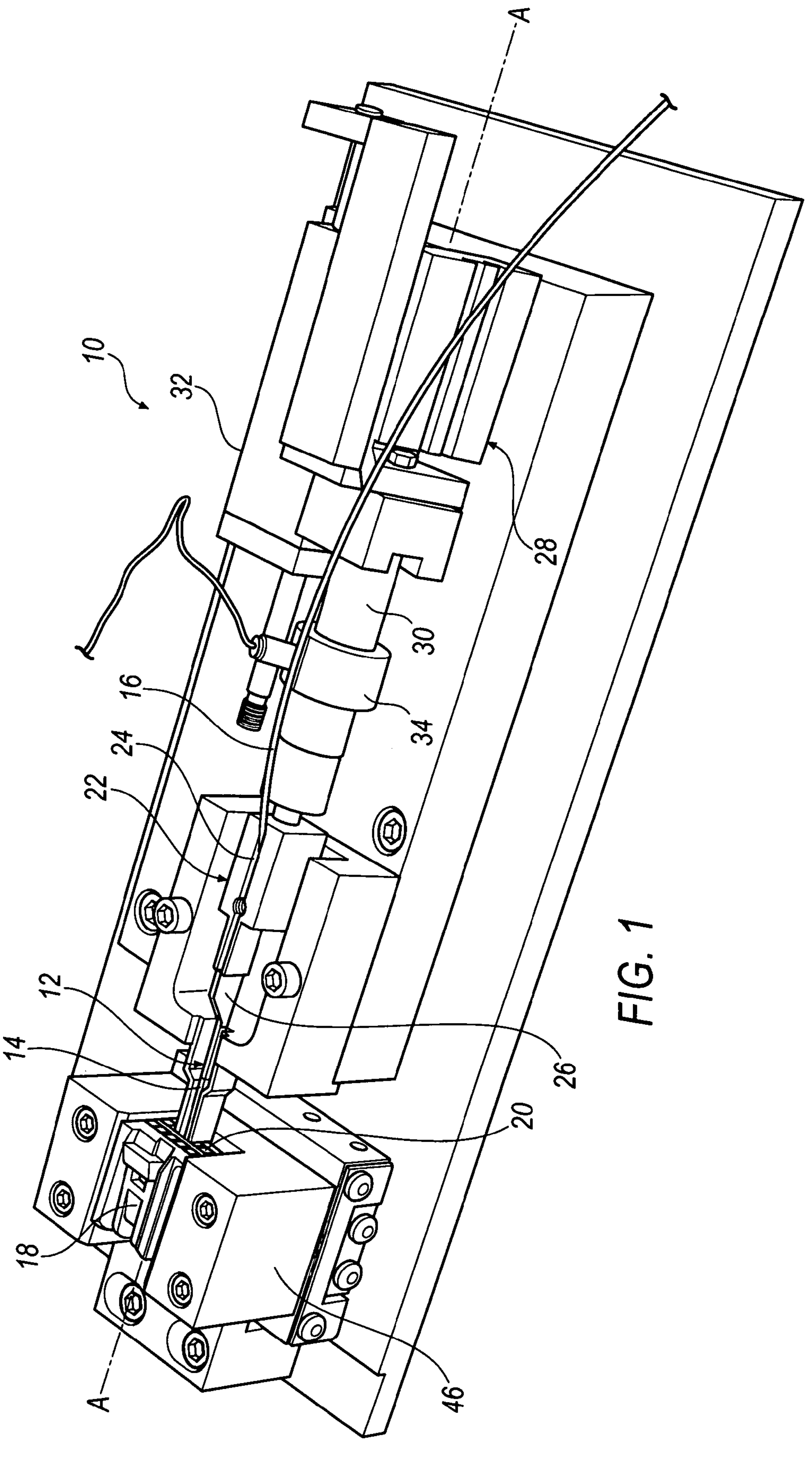
FIG. 1 is a perspective view of an exemplary lead insertion system having a holding device, a position sensor, and an actuator.

Referring to the figures, where like numerals indicate like or corresponding parts throughout the several views, FIG. 1 illustrates an exemplary lead insertion system 10 having a lead 12 that is formed from a terminal 14 crimped onto a wire 16. It is to be appreciated that the terminal 14 may be manually crimped onto the wire 16 with a hand crimper, or alternatively, the terminal 14 may be crimped onto the wire 16 automatically with, for example, an automatic crimping device. Furthermore, it is to be understood that the lead 12 may be any other type of lead known in the art. For instance, the lead 12 may be a wire extending from an electrical component.

A connector 18 is spaced from and aligned with the lead 12. The connector 18 defines a plurality of openings 20, and at least one of the openings 20 is aligned with the lead 12. During operation, the lead insertion system 10 inserts the lead 12 into the opening 20 of the connector 18. It is to be understood that the connector 18 may be any connector 18 known in the art that defines an opening 20 for receiving the lead 12. For instance, the lead insertion system 10 may be used with a circuit board defining a plurality of openings 20 for receiving at least one lead 12 from various electrical components. In that instance, the circuit board acts as the connector 18.

Figure 2:
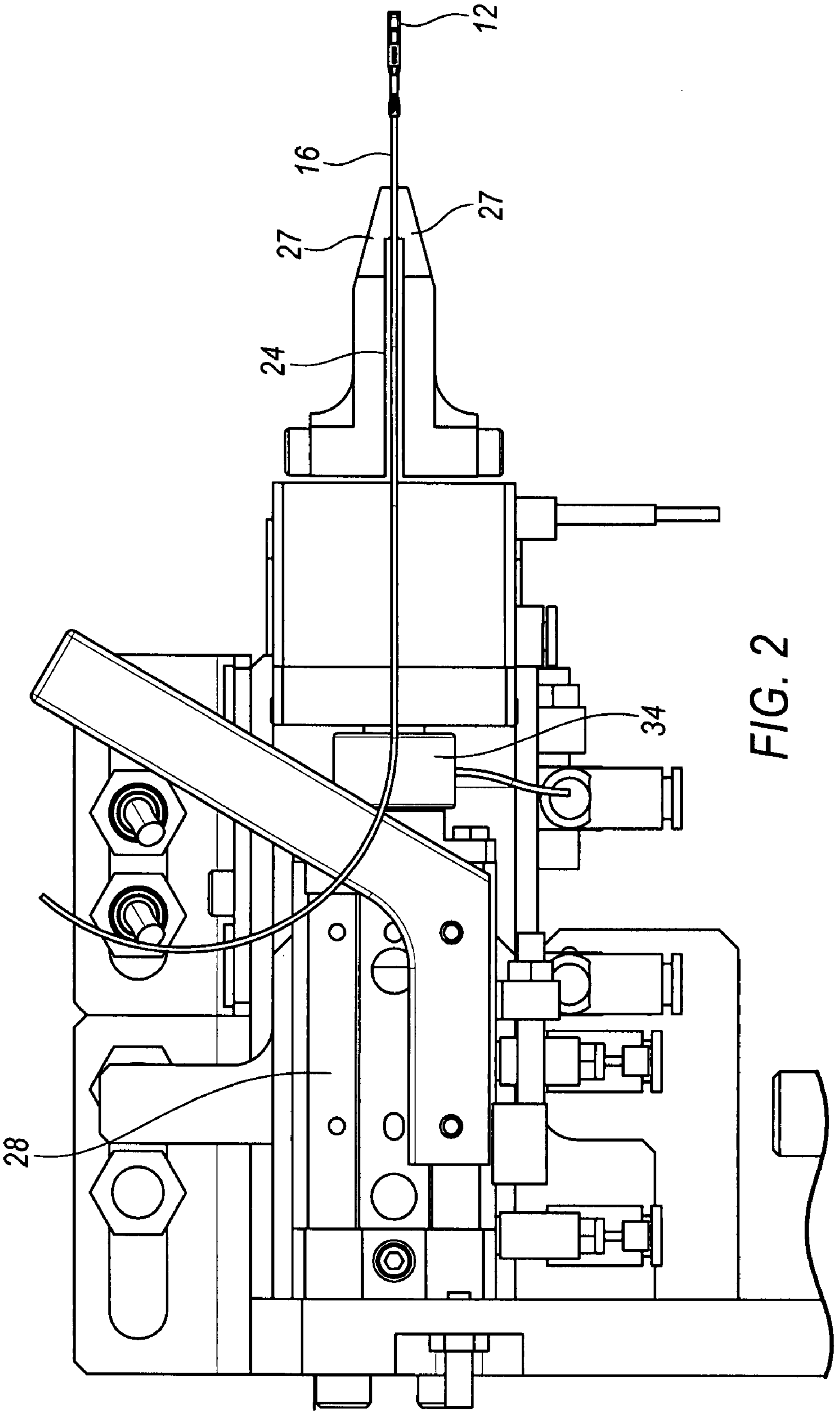
FIG. 2 is a bottom view of an alternative embodiment of the holding device of the lead insertion system.

The lead insertion system 10 further includes a holding device 22 for supporting the lead 12 while the lead 12 is being inserted into the opening 20 of the connector 18. As shown in FIG. 1, the holding device 22 defines a channel 24 aligned with the opening 20 of the connector 18, and the lead 12 is placed in the channel 24. The opening 20 of the connector 18 defines an insertion axis A along which the channel 24 is coaxially aligned. The lead 12 rests in the channel 24 coaxially aligned with the opening 20 to allow the lead 12 to be inserted into the opening 20 by traveling along the insertion axis A. It is to be understood that the holding device 22 may include additional or alternative features for supporting the lead 12 while the lead 12 is being inserted into the opening 20 of the connector 18. In one embodiment, as shown in FIG. 1, in addition to the channel 24, the holding device 22 includes fingers 26 for pushing the lead 12 into the opening 20 during insertion. In another embodiment, as shown in FIG. 2, the holding device 22 includes a gripper 27. The gripper 27 grips the wire 16 while the lead 12 is being inserted into the opening 20.

Referring back to FIG. 1, the lead insertion system 10 includes an actuator 28 coupled to the holding device 22 for moving the holding device 22 and the lead 12 along the insertion axis A. During operation, the actuator 28 moves the holding device 22 and the lead 12 through a plurality of positions located along the insertion axis A. The actuator 28 of FIG. 1 is shown as an actuator 28 having a shaft 30 that moves along the insertion axis A. For instance, the actuator 28 may include a servo drive mechanism, such as a servo motor coupled to a screw shaft, which moves along the insertion axis A. Therefore, it is to be understood that the actuator 28 may be any type of actuator 28 known in the art. It is also to be appreciated that the actuator 28 may be electrically or pneumatically operated.

To determine a position of the lead 12 relative to the opening 20 of the connector 18 along the insertion axis A, the lead insertion system 10 includes a position sensor 32 operatively connected to at least one of the actuator 28 and the holding device 22. For instance, the position sensor 32 may be directly connected to the lead 12 to measure the position. Alternatively, the position sensor 32 may be directly connected to either the actuator 28 or the holding device 22 to measure the position of the actuator 28 or the holding device 22, respectively, and determine the actual position of the lead 12 based on the position of the actuator 28 or the holding device 22. Since the holding device 22 moves with the actuator 28 and the lead 12 is secured to the holding device 22, any movement along the insertion axis A of the actuator 28 will result in similar movement of the holding device 22 and the lead 12. Therefore, movement of the holding device 22 and the actuator 28 is directly related to the movement of the lead 12 along the insertion axis A. Because of this, the position sensor 32 need not measure the actual position of the lead 12 directly. Rather, the actual position of the lead 12 can be determined by measuring the actual position of the actuator 28 or the holding device 22 with position sensor 32. It is to be understood that the position sensor 32 may be any sensor known in the art that can directly or indirectly determine the position of the lead 12. For instance, the position sensor 32 may include an encoder.

The lead insertion system 10 of FIG. 1 further includes a force sensor 34 operatively connected to the actuator 28. The force sensor 34 may be any sensor known in the art capable of measuring the force exerted by the actuator 28. For instance, the force sensor 34 may include a load cell. To move the holding device 22 and the lead 12, the actuator 28 exerts an actual force. The force sensor 34 measures the actual force exerted by the actuator 28 at each of the plurality of positions to define an actual force signature 36. In other words, the actual force signature 36 is a sampling of the actual force exerted by the actuator 28 at each of the plurality of positions. The force sensor 34 measures the actual force exerted by the actuator 28 while the position sensor 32 is used to determine the position of the lead 12 when the actual force is applied. Therefore, the actual force signature 36 indicates the different actual forces that are exerted by the actuator 28 as the lead 12 moves through the plurality of positions until the lead 12 is inserted into the opening 20 of the connector 18.

Figure 3:
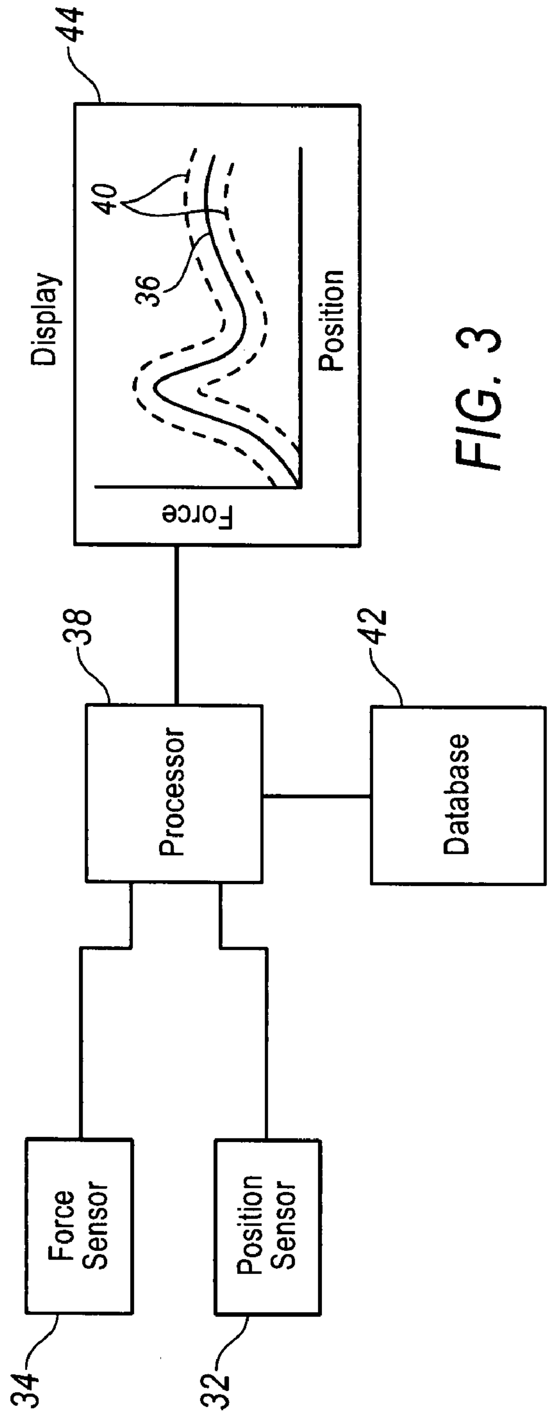
FIG. 3 is a block diagram of an actual force signature and a predetermined force signature indicating a secure insertion.
Figure 4:
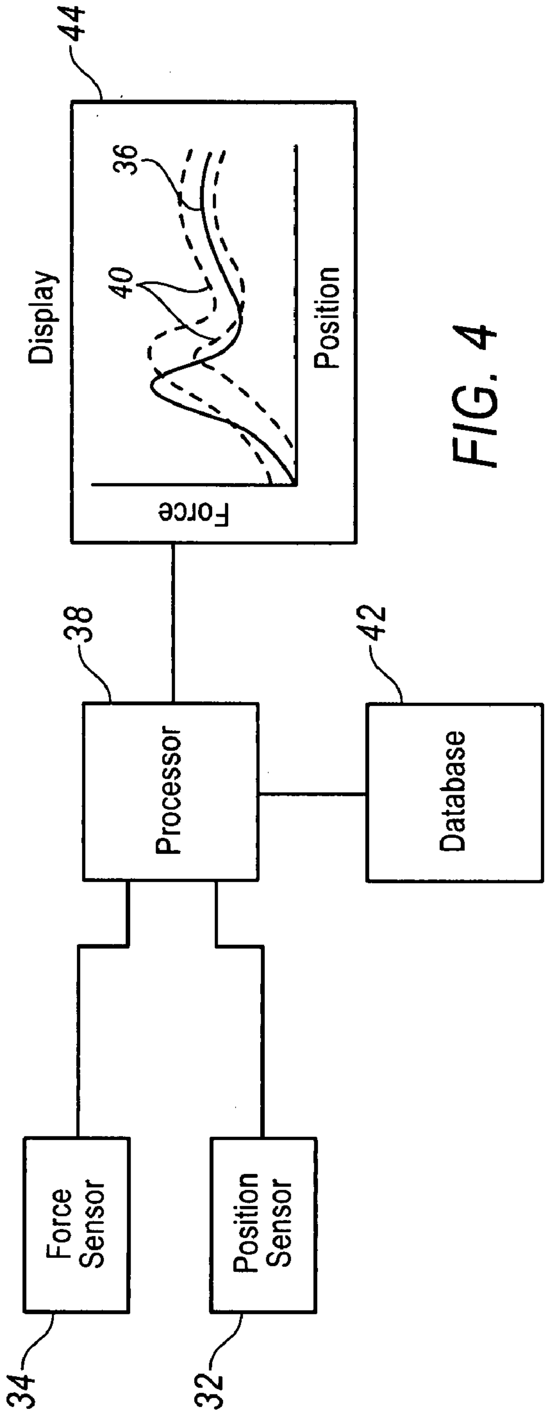
FIG. 4 is a block diagram of an actual force signature and a predetermined force signature indicating an unsecured insertion.

As shown in FIGS. 3 and 4, the lead insertion system 10 includes a processor 38 electrically connected to the force sensor 34 and the position sensor 32. The processor 38 receives the actual force exerted by the actuator 28 from the force sensor 34 and the actual position of the lead 12 from the position sensor 32 to generate the actual force signature 36. The processor 38 then compares the actual force signature 36 to a predetermined force signature 40 defined by a predetermined range of acceptable forces at each of the plurality of positions. Preferably, the predetermined force signature 40 is stored in a database 42 that is in communication with the processor 38. The database 42 may be any database 42 known in the art capable of transmitting information to the processor 38. Once the predetermined range of acceptable forces at each of the plurality of positions has been established to define the predetermined force signature 40, the predetermined force signature 40 is uploaded to the database 42. When needed, the database 42 transmits the predetermined force signature 40 to the processor 38, and the processor 38 is able to compare the predetermined force signature 40 to the actual force signature 36 to determine whether the lead 12 is securely inserted into the opening 20 of the connector 18. The predetermined force signature 40 may be changed as needed since different forces may be needed to insert the lead 12 into different types of connectors, and a different predetermined force signature 40 may be required for each different type of connector 18.

The processor 38 may output the actual force signature 36 and the predetermined force signature 40 to a display 44 to indicate whether the lead 12 was securely inserted into the opening 20 of the connector 18. As shown in FIGS. 3 and 4, the display 44 may show a graph of the actual force signature 36 with the actual position of the lead 12 along the x-axis and the actual force exerted on the y-axis. Similarly, the display 44 may show a graph of the predetermined force signature 40 with the plurality of positions on the x-axis and the predetermined range of acceptable forces on the y-axis. It is to be understood that the display 44 may show the graph of the actual force signature 36 and the graph of the predetermined force signature 40 simultaneously. It is also to be understood that the actual force signature 36 and the predetermined force signature 40 may be shown on the display 44 in other ways. For instance, the actual force, the actual position and the predetermined range of acceptable forces at each of the plurality of positions may be listed on the display 44 instead of graphed. Regardless of how the actual force signature 36 and the predetermined force signature 40 are presented, the display 44 will show an operator whether the actual force was applied by the actuator 28 when the lead 12 was at the correct position.

Referring now to FIG. 3, the display 44 shows the actual force signature 36 completely within the predetermined force signature 40. In other words, each actual force measured by the force sensor 34 at each of the plurality of positions is within the predetermined range of acceptable forces. The actual force signature 36 exerted by the actuator 28 being within the predetermined force signature 40 is indicative of the lead 12 being securely inserted into the opening 20 of the connector 18. Therefore, as shown in FIG. 3, the actual force was applied correctly at each of the plurality of positions, and the operator may conclude that the lead 12 is securely disposed within the opening 20 of the connector 18.

Referring now to FIG. 4, the actual force signature 36 is partially outside the predetermined force signature 40. In other words, at least one of the actual forces measured by the force sensor 34 exceeded or fell below the predetermined range of acceptable forces. The actual force signature 36 having at least one actual force outside the predetermined force signature 40 is indicative of the lead 12 not being securely inserted into the opening 20 of the connector 18. Therefore, as shown in FIG. 4; the actual force was not applied correctly at each of the plurality of positions, and the operator may conclude that the lead 12 is not securely disposed within the opening 20 of the connector 18.

Referring again to FIG. 1, the lead insertion system 10 may further include a nest 46 spaced from the holding device 22. The nest 46 holds the connector 18 in place while the lead 12 is being inserted. In order to securely insert the lead 12 into the opening 20 of the connector 18, the lead 12 may need to be aligned with the opening 20. Once aligned, any movement of the connector 18 could misalign the lead 12 from the opening 20, which may prevent the lead 12 from being securely inserted. To prevent movement of the connector 18, the nest is at least partially disposed about the connector 18.

Figure 5:
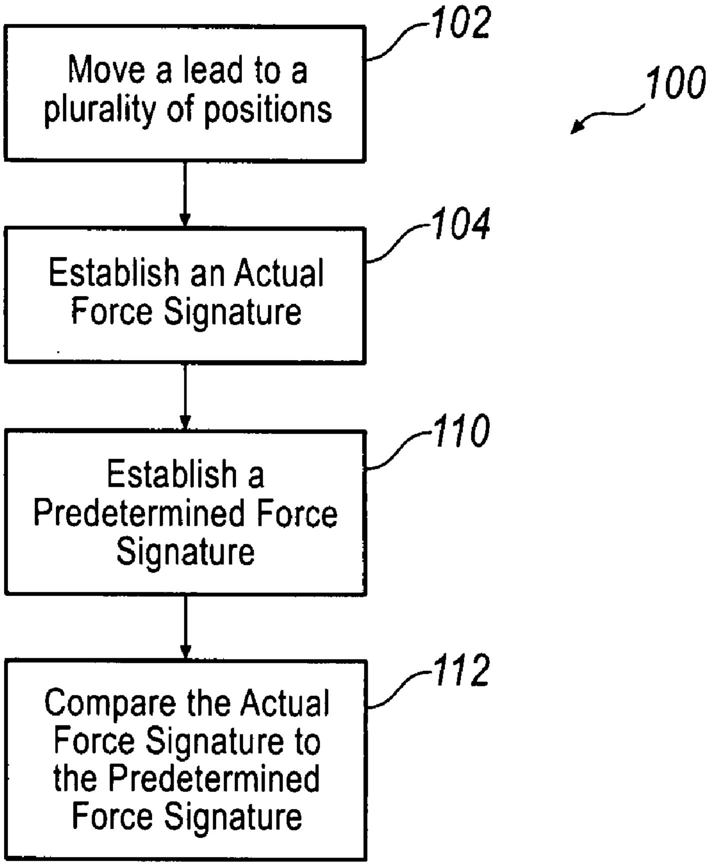
FIG. 5 is a flowchart of a method for determining whether the lead was securely inserted into a connector.
Figure 6:
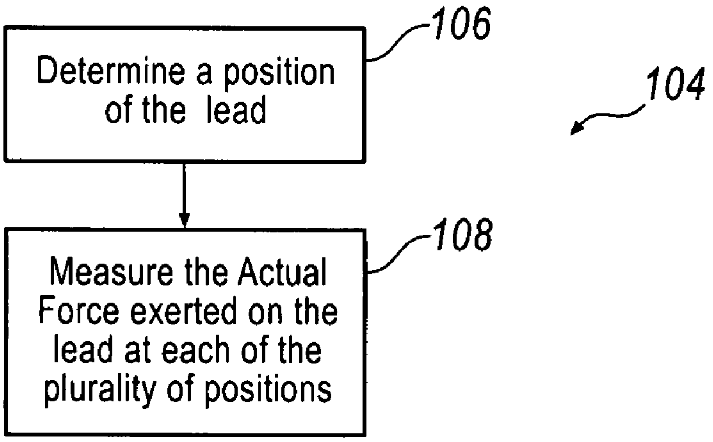
FIG. 6 is a flowchart of a method for establishing the actual force signature.

Referring now to FIG. 5, a method 100 of inserting the lead 12 into the opening 20 defined by the connector 18 is provided. The method 100 includes the step 102 of moving the lead 12 to a plurality of positions. As previously discussed, the plurality of positions may be along the insertion axis A. The method 100 further includes the step 104 of establishing an actual force signature 36 based on the movement of the lead 12. As shown in FIG. 6, the step of establishing the actual force signature 36 based on the movement of the lead 12 (step 104) includes the step 106 of determining the position of the lead 12 and the step 108 of measuring the actual force exerted by the actuator 28 on the lead 12 at each of the plurality of positions. As discussed above, the position is measured by the position sensor 32 and the actual force is measured by the force sensor 34.

Referring to FIG. 5, the method 100 further includes the step 110 of establishing the predetermined force signature 40. As previously discussed, the predetermined force signature 40 is defined by the predetermined range of acceptable forces at each of the plurality of positions. Once the predetermined force signature 40 has been established, the method 100 includes the step 112 of comparing the actual force signature 36 to the predetermined force signature 40 to determine whether the lead 12 has been inserted into the opening 20 defined by the connector 18.

Figure 7:
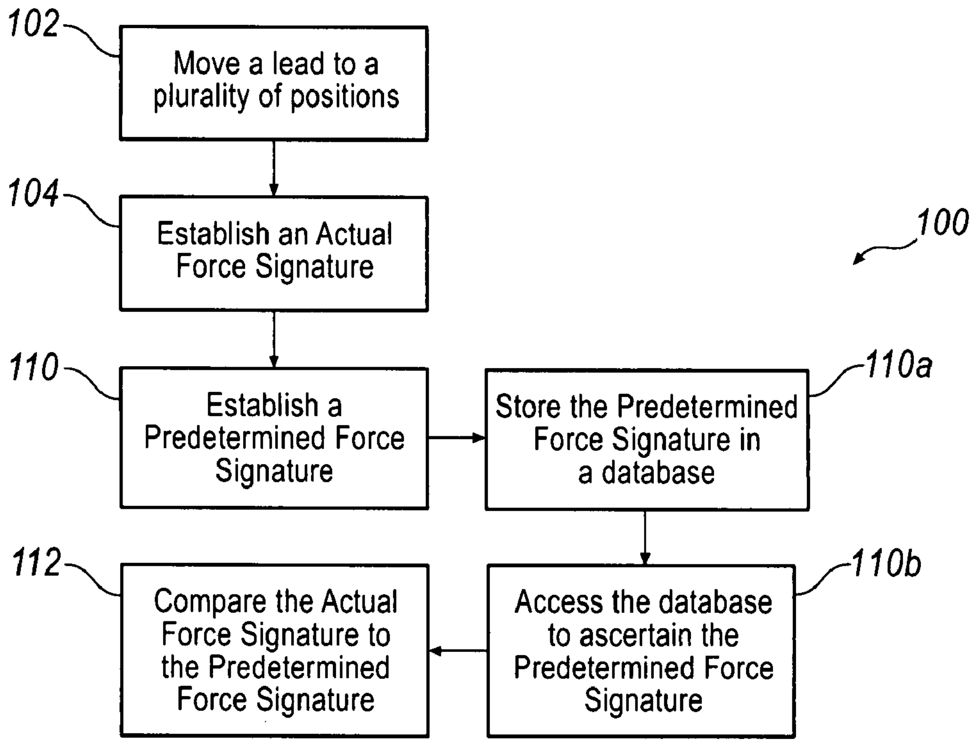
FIG. 7 is a flowchart of the method shown in FIG. 4 including steps of storing the predetermined force signature in a database and accessing the database to ascertain the predetermined force signature.

Referring now to FIG. 7, the method 100 may further include the step 110*a* of storing the predetermined force signature 40 in the database 42. Accordingly, the method 100 includes the step 110*b* of accessing the database 42 to ascertain the predetermined force signature 40. The database 42 transmits the predetermined force signature 40 to the processor 38 so the processor 38 may compare the actual force signature 36 to the predetermined force signature 40, as shown in step 112.

Figure 8:
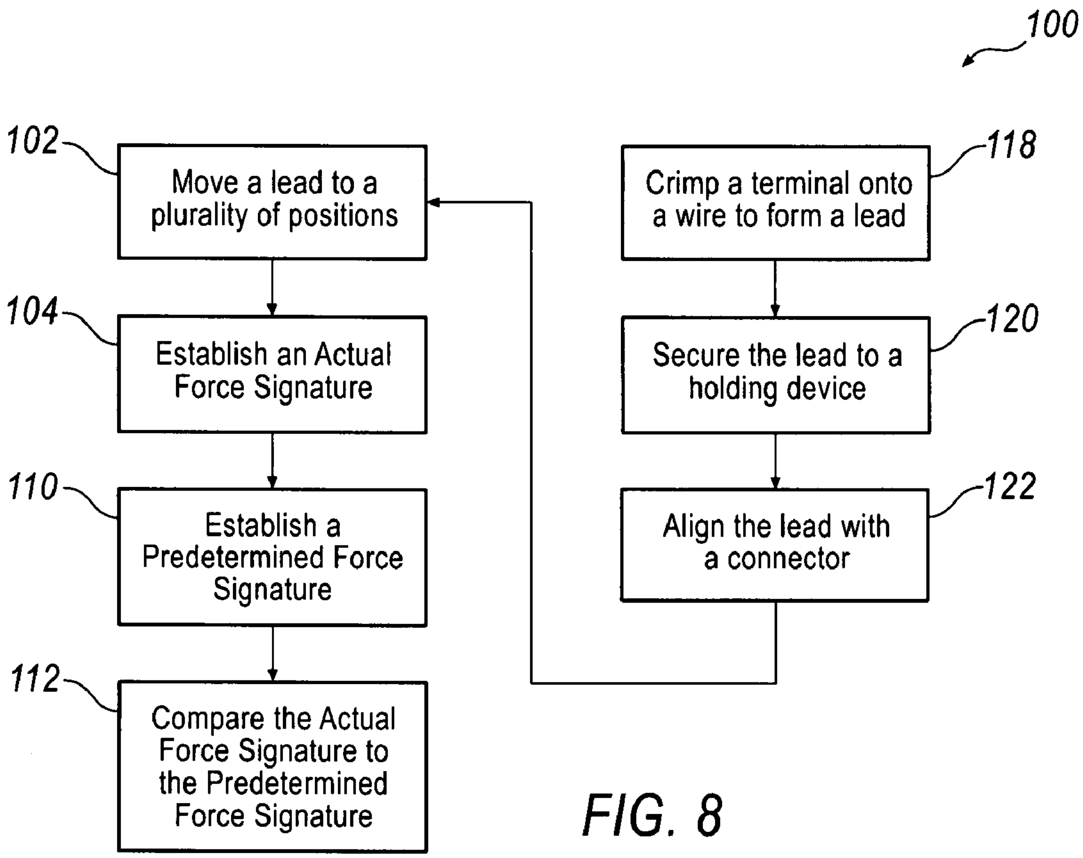
FIG. 8 is a flowchart of the method shown in FIG. 4 including steps of crimping a terminal onto a wire to form the lead, securing the lead to a holding device, and aligned the lead with the connector.

Referring now to FIG. 8, the lead 12 may be formed from the terminal 14 crimped onto the wire 16. Therefore, the method 100 may further include the step 118 of crimping the terminal 14 onto the wire 16 to form the lead 12. It is to be understood that the step 118 of crimping may be performed manually by an operator, or alternatively, the step 118 may be performed automatically by a crimping machine. Once the lead 12 is formed, the method 100 may further include the step 120 of securing the lead 12 to the holding device 22. If the holding device 22 includes a channel 24 as shown in FIG. 1, the step 120 of securing the lead 12 to the holding device 22 may further include disposing the lead 12 in the channel 24 defined by the holding device 22. Disposing the lead 12 into the channel 24 may be further defined as manually or automatically placing the lead 12 in the channel 24. Once secured to the holding device 22, the method 100 may further include a step 122 of aligning the lead 12 with the opening 20 in the connector 18. Aligning the lead 12 with the opening 20 may be performed manually by an operator or automatically with a lead alignment device.

The present embodiments have been particularly shown and described with reference to the foregoing examples, which are merely illustrative of the best modes for carrying out the invention. It should be understood by those skilled in the art that various alternatives to the examples of the invention described herein may be employed in practicing the invention without departing from the spirit and scope of the invention as defined in the following claims. The examples should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

It is to be understood that the above description is intended to be illustrative and not restrictive. Many alternative approaches or applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future examples. In sum, it should be understood that the invention is capable of modification and variation and is limited only by the following claims.

The present embodiments have been particularly shown and described, which are merely illustrative of the best modes. It should be understood by those skilled in the art that various alternatives to the embodiments described herein may be employed in practicing the claims without departing from the spirit and scope as defined in the following claims. It is intended that the following claims define the scope of the invention and that the method and apparatus within the scope of these claims and their equivalents be covered thereby. This description should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What we claim is:

1. An apparatus for determining whether a lead is securely inserted into an opening defined by a connector, said apparatus comprising:

an actuator for moving said lead along an insertion route;

a position sensor operatively connected to said actuator; and an insertion force sensor operatively connected to said actuator for measuring an actual insertion force exerted by said actuator at each of a plurality of positions of said lead as sensed by said position sensor along said insertion route to define an actual insertion force signature of said lead without pulling back on said lead.

2. An apparatus as set forth in claim 1 further comprising a holding device coupled to said actuator for moving the lead with said actuator.

3. An apparatus as set forth in claim 2 further comprising a nest spaced from said holding device for receiving the connector and preventing movement of the connector.

4. An apparatus for determining whether a lead is securely inserted into an opening defined by a connector, said apparatus comprising:

an actuator;

a position sensor operatively connected to said actuator;

a force sensor operatively connected to said actuator for measuring an actual force exerted by said actuator at each of a plurality of positions to define an actual force signature; and a processor in electrical communication with said force sensor and said position sensor for comparing said actual force signature to a predetermined force signature defined by a predetermined range of forces at each of the plurality of positions.

5. An apparatus as set forth in claim 4 further comprising a database for storing said predetermined force signature and wherein said database is in communication with said processor.

6. A system for determining whether a lead is securely inserted into an opening defined by a connector, said system comprising:

a means for establishing an actual force signature based on the insertion movement of the lead along a plurality of positions of said lead as it is inserted into said opening;

a means for establishing a predetermined force signature based on a predetermined range of actual forces measured at each of the plurality of positions; and a means for comparing the actual force signature to the predetermined force signature at each of the plurality of positions for determining that the lead is securely disposed within said opening when said actual force signature is within said predetermined force signature and determine that the lead is not securely disposed within said opening when said actual force signature has at least one actual force outside the predetermined force signature.

7. The system as set forth in claim 6 wherein said means for establishing the actual force signature based on the insertion movement of the lead includes a means for determining a position of the lead.

8. The system as set forth in claim 7 wherein said means for establishing the actual force signature based on the insertion movement of the lead further includes a means for measuring an actual force exerted on the lead at each of the plurality of positions.

9. The system as set forth in claim 6 further comprising a means for storing the predetermined force signature in a database.

10. The system as set forth in claim 9 further comprising a means for accessing the database to ascertain the predetermined force signature.

11. The system as set forth in claim 6 further comprising a means for securing the lead to a holding device.

12. The system as set forth in claim 6 further comprising a means for aligning the lead with the opening in the connector.

13. A method of determining whether a lead is securely inserted into an opening defined by a connector, said method comprising the steps of:

establishing an actual force signature based on the movement of the lead along a plurality of positions;

establishing a predetermined force signature based on a predetermined range of forces at each of the plurality of positions; and comparing the actual force signature to the predetermined force signature at each of the plurality of positions for determining that lead is securely disposed within said opening when said actual force signature is within said predetermined force signature and determine that the lead is not securely disposed within said opening when said actual force signature has at least one actual force outside the predetermined force signature.

14. A method as set forth in claim 13 wherein said step of establishing the actual force signature based on the movement of the lead includes the step of determining a position of the lead.

15. A method as set forth in claim 14 wherein said step of establishing the actual force signature based on the movement of the lead further includes the step of measuring an actual force exerted on the lead at each of the plurality of positions.

16. A method as set forth in claim 13 further comprising the step of storing the predetermined force signature in the database.

17. A method as set forth in claim 13 further comprising the step of securing the lead to a holding device.

18. A method as set forth in claim 13 further comprising the step of aligning the lead with the opening in the connector.

* * * * *